US009236406B2

(12) United States Patent
Kuroda

(10) Patent No.: US 9,236,406 B2
(45) Date of Patent: Jan. 12, 2016

(54) PHOTOELECTRIC CONVERSION APPARATUS WITH GATE CONTROL LINES AND WIRING AT SAME HEIGHT

(71) Applicant: CANON KABUSHIKI KAISHA, Tokyo (JP)

(72) Inventor: Yukihiro Kuroda, Inagi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 110 days.

(21) Appl. No.: 13/871,742

(22) Filed: Apr. 26, 2013

(65) Prior Publication Data

US 2013/0313622 A1 Nov. 28, 2013

(30) Foreign Application Priority Data

May 24, 2012 (JP) .................................. 2012-118613

(51) Int. Cl.
*H01L 31/062* (2012.01)
*H01L 31/113* (2006.01)
*H01L 27/146* (2006.01)

(52) U.S. Cl.
CPC ........ *H01L 27/146* (2013.01); *H01L 27/14603* (2013.01); *H01L 27/14641* (2013.01)

(58) Field of Classification Search
CPC .................. H01L 27/14609; H01L 27/14643
USPC ......................................................... 257/292
See application file for complete search history.

(56) References Cited

U.S. PATENT DOCUMENTS

| 6,521,926 | B1 * | 2/2003 | Sasaki | ............... | H01L 27/14609 |
| | | | | | 250/208.1 |
| 7,242,043 | B2 * | 7/2007 | Ohkawa | ............ | H01L 27/14601 |
| | | | | | 257/233 |
| 7,592,575 | B2 | 9/2009 | Kochi | ......... | 250/208.1 |
| 7,709,869 | B2 | 5/2010 | Kuroda | ......................... | 257/291 |
| 7,911,521 | B2 * | 3/2011 | Kuroda | ............. | H01L 27/14603 |
| | | | | | 257/292 |
| 7,935,995 | B2 * | 5/2011 | Watanabe | ......... | H01L 27/14603 |
| | | | | | 257/292 |
| 8,026,469 | B2 | 9/2011 | Kochi | ......... | 250/208.1 |
| 8,174,599 | B2 | 5/2012 | Kuroda et al. | ................ | 348/301 |
| 8,223,238 | B2 | 7/2012 | Kuroda et al. | ................ | 348/308 |
| 8,345,137 | B2 | 1/2013 | Shinohara et al. | ............ | 348/308 |
| 2005/0237405 | A1 * | 10/2005 | Ohkawa | ....................... | 348/308 |

(Continued)

FOREIGN PATENT DOCUMENTS

JP 2004-186407 A 7/2004
JP 2006-211363 A 8/2006

*Primary Examiner* — Lex Malsawma
*Assistant Examiner* — Eric Jones
(74) *Attorney, Agent, or Firm* — Fitzpatrick, Cella, Harper & Scinto

(57) ABSTRACT

A photoelectric conversion apparatus in which each of a plurality of pixels includes a photoelectric conversion element configured to generate an electric charge by a photoelectric conversion, an impurity diffusion region, and a gate electrode configured to transfer the electric charge from the photoelectric conversion element to the impurity diffusion region. The photoelectric conversion apparatus includes a gate control line composed of a metal wiring extending in a first direction and being connected electrically to the gate electrode. Some or all of the impurity diffusion regions of the plurality of pixels are mutually connected. A read out circuit region is arranged in an outside in a second direction from a pixel arranged at a most outside among all of the plurality of pixels. A metal wiring layer arranged in a pixel array region is composed of only a single wiring layer including a plurality of wirings in the same height.

9 Claims, 6 Drawing Sheets

(56) References Cited

U.S. PATENT DOCUMENTS

| | | | |
|---|---|---|---|
| 2006/0169871 A1 | 8/2006 | Kochi | 250/208.1 |
| 2008/0029787 A1* | 2/2008 | Watanabe et al. | 257/233 |
| 2008/0303930 A1* | 12/2008 | Kuroda et al. | 348/308 |
| 2010/0006744 A1 | 1/2010 | Kochi | 250/208.1 |
| 2010/0134664 A1* | 6/2010 | Kuroda et al. | 348/280 |
| 2010/0201856 A1 | 8/2010 | Hayashi et al. | 348/296 |
| 2012/0175503 A1 | 7/2012 | Kuroda et al. | 250/214 A |
| 2012/0193690 A1 | 8/2012 | Inoue et al. | 257/290 |

\* cited by examiner

US 9,236,406 B2

PHOTOELECTRIC CONVERSION APPARATUS WITH GATE CONTROL LINES AND WIRING AT SAME HEIGHT

BACKGROUND OF THE INVENTION

1. Field of the Invention

The present invention relates to a photoelectric conversion apparatus.

2. Description of the Related Art

In recent years, photoelectric conversion apparatuses, for example, a CCD image sensor and a CMOS image sensor have been used for an image read out apparatus such as a copy machine, and techniques for obtaining excellent images have been disclosed (see Japanese Patent Application Laid-Open No. 2006-211363, for example). Such a photoelectric conversion apparatus includes photoelectric conversion elements which convert a light signal into an electrical signal. For improved resolution of the photoelectric conversion apparatus, the sensitivity of the photoelectric conversion elements to a light signal needs to be increased. Also disclosed is a technique for reducing the number of wiring layers in an imaging region where photoelectric conversion elements are arranged, in order to increase the sensitivity of the photoelectric conversion elements (see Japanese Patent Application Laid-Open No. 2004-186407, for example).

In the technique disclosed in Japanese Patent Application Laid-Open No. 2006-211363, circuits for reading out signals are arranged between the photoelectric conversion elements. As a result, it is unfortunately difficult to reduce the number of wiring layers in the imaging region, while maintaining a sufficient area for the photoelectric conversion elements. In the technique disclosed in Japanese Patent Application Laid-Open No. 2004-186407, a metal wiring layer in the imaging region can be composed of only a single layer. However, transfer control signal lines for reading out electric charges accumulated in the photoelectric conversion elements, and reset control signal lines for resetting the electric charges accumulated in the photoelectric conversion elements have to be routed in a poly silicon layer. Unfortunately, such a configuration cannot accommodate a higher rate resulting from improved resolution of the photoelectric conversion apparatus.

The present invention has been made in the light of the above mentioned problems. The object of the present invention is to provide a photoelectric conversion apparatus in which a metal wiring layer can be composed of only a single wiring layer without a decrease in the read out rate.

SUMMARY OF THE INVENTION

According to an aspect of the present invention, a photoelectric conversion apparatus comprises: a pixel array region in which a plurality of pixels are arranged; and a read out circuit region arranged in an outside of the pixel array region, wherein each of the pixels including a photoelectric conversion element configured to generate an electric charge by a photoelectric conversion, an impurity diffusion region, and a gate electrode configured to transfer the electric charge from the photoelectric conversion element to the impurity diffusion region, wherein the photoelectric conversion apparatus further comprises: a gate control line formed from a metal wiring extending in a first direction and being connected electrically to the gate electrode, and wherein two or more of the impurity diffusion regions of the plurality of pixels are electrically connected mutually, in the pixel array region, a plurality of pixels of a first color arranged in the first direction, and a plurality of pixels of a second color arranged in the first direction, the first and second colors are different from each other, the pixel of the first color and the pixel of the second color are adjacent to each other in a second direction different from the first direction, the read out circuit region is arranged in an outside in the second direction from a pixel arranged at a most outside among all of the plurality of pixels, in the read out circuit region, an amplifier unit configured to amplify a signal based on a voltage change in the impurity diffusion region, and a reset unit configured to supply a reset voltage to the impurity diffusion region, and a metal wiring layer arranged in the pixel array region formed from only a single wiring layer including a plurality of wirings arranged in the same height.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

(First Embodiment)

Figure 1:
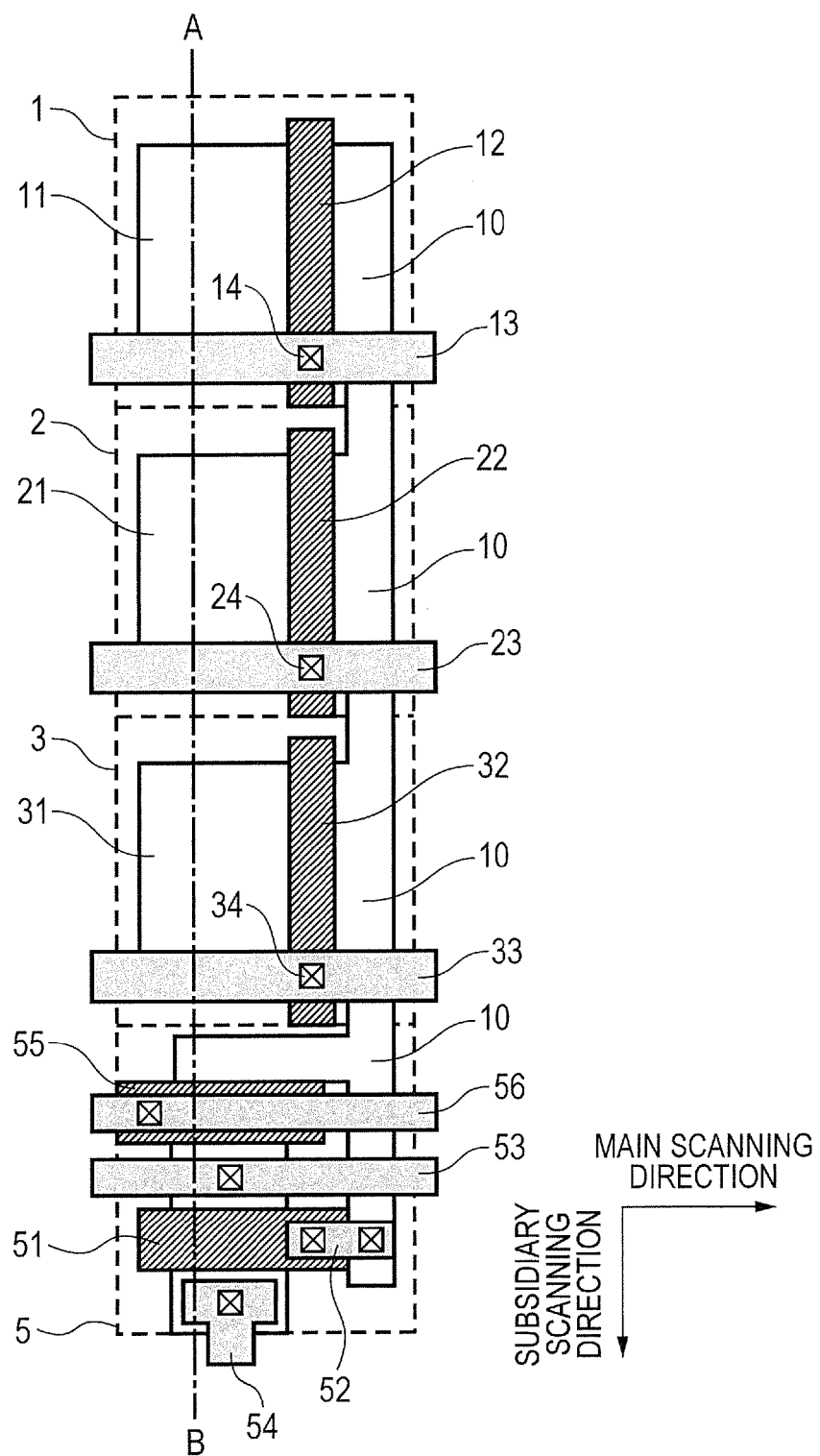
FIG. 1 is a view illustrating an area of imaging region of a photoelectric conversion apparatus according to a first embodiment.

FIG. 1 is an enlarged view of part of a photoelectric conversion apparatus according to a first embodiment of the present invention. The horizontal direction in FIG. 1 is the main scanning direction (first direction) and the vertical direction in FIG. 1 is the subsidiary scanning direction (second direction). The subsidiary scanning direction is different from (perpendicular to) the main scanning direction. The photoelectric conversion apparatus includes a pixel array region in which a plurality of pixels 1, 2 and 3 are arranged, and a read out circuit region 5. The plurality of pixels 1, 2 and 3 include photoelectric conversion elements 11, 21 and 31, gate electrodes 12, 22 and 32, gate control lines 13, 23 and 33, and an impurity diffusion regions 10. The gate control lines 13, 23 and 33 extend in the main scanning direction. The gate control lines are composed of metal wirings. The gate control lines 13, 23 and 33 are electrically connected to the gate electrodes 12, 22 and 32 via contact plugs 14, 24 and 34, respectively. The impurity diffusion regions 10 of the plurality of pixels 1, 2 and 3 are all mutually and commonly connected. In particular, "all mutually and commonly connected" means that some or all of the impurity diffusion regions 10 of the plurality of pixels 1, 2 and 3 are arranged in the same active region, for example. In the read out circuit region 5, a read out circuit for the pixels 1, 2 and 3 is arranged. The read out circuit region 5 includes an amplifying transistor which uses a gate electrode 51 as its gate, and a reset transistor which uses a gate electrode 55 as its gate. The read out circuit region 5 is arranged in the outside in the subsidiary scanning direction from the pixel 3 arranged at the most outside among all of the plurality of pixels 1, 2 and 3. The gate electrode 51 of the amplifying transistor is electrically connected to the impurity diffusion regions 10 via a metal wiring 52 and contact plugs outside the pixel array region, and the drain is electrically connected to a power source line 53 composed of a metal wiring arranged outside the pixel array region. The source of the amplifying transistor is electrically connected to a surrounding circuit (not shown) via a metal wiring 54 arranged outside the pixel array region. The surround circuit may be a noise cancelling circuit or an amplifying circuit, for example. The gate electrode 55 of the reset transistor is electrically connected to a reset control line 56 composed of a metal wiring arranged outside the pixel array region, and the drain is electrically connected to the power source line 53 arranged outside the pixel array region. The source of the reset transistor is commonly connected to the impurity diffusion regions 10. In particular, "The source of the reset transistor is commonly connected to the impurity diffusion regions 10" means that the source of the reset transistor and some of the impurity diffusion regions 10 are arranged in the same active region, for example.

Figure 2:
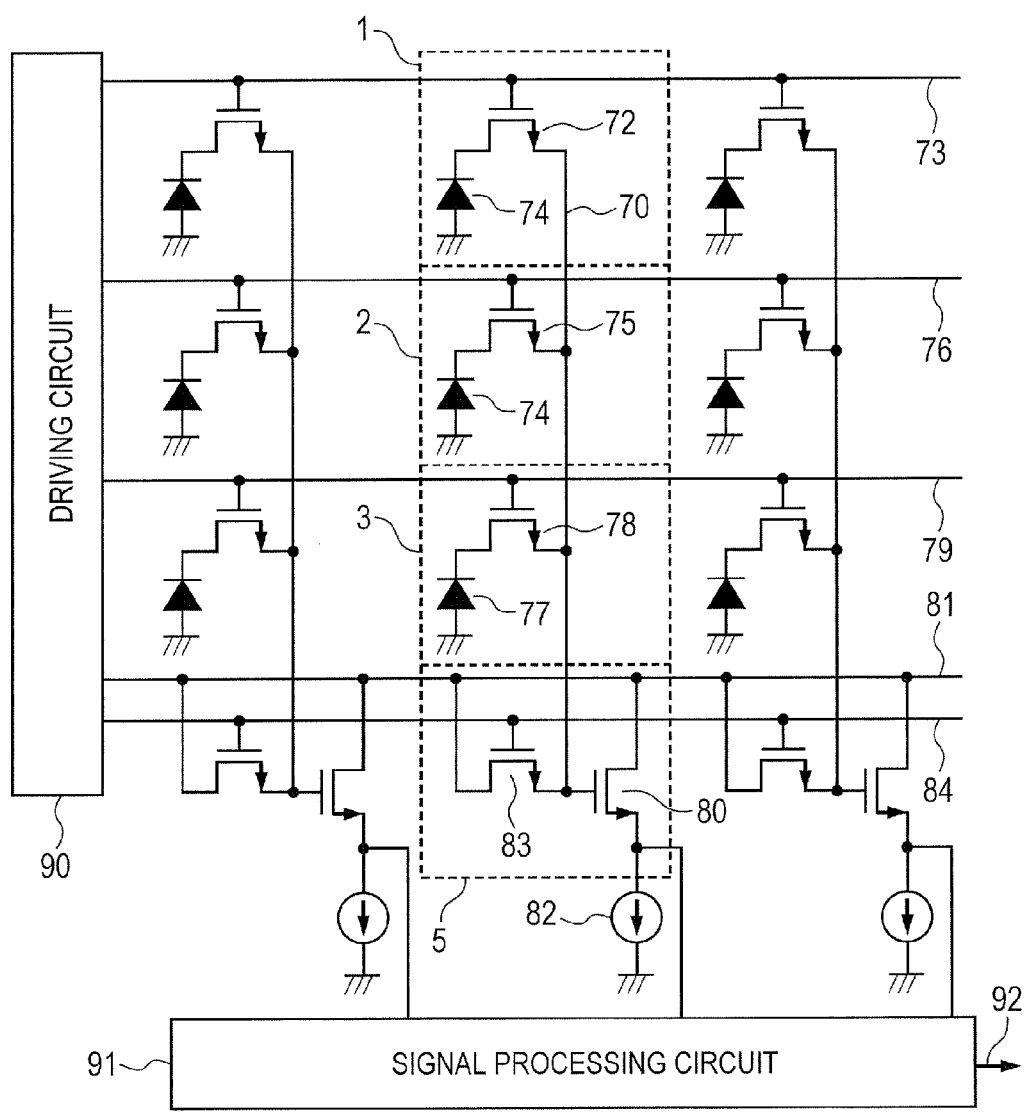
FIG. 2 is a view illustrating an exemplary configuration of the photoelectric conversion apparatus according to the first embodiment.

FIG. 2 is a circuit diagram illustrating an exemplary configuration of the photoelectric conversion apparatus according to the first embodiment of the present invention. Pixels 1, 2 and 3 correspond to the pixels 1, 2 and 3 in FIG. 1. A read out circuit region 5 of the pixels 1, 2 and 3 includes elements corresponding to those arranged in the read out circuit region 5 in FIG. 1. The pixels 1, 2 and 3 include photoelectric conversion elements 71, 74 and 77, transfer transistors 72, 75 and 78, and gate control lines 73, 76 and 79. The gates of the transfer transistors 72, 75 and 78 correspond to the gate electrodes 12, 22 and 32 in FIG. 1. The gate control lines 73, 76 and 79 correspond to the gate control lines 13, 23 and 33 in FIG. 1. A connecting line 70 corresponds to the impurity diffusion regions 10 in FIG. 1. The read out circuit region 5 includes an amplifying transistor (amplifier unit) 80, a reset transistor (reset unit) 83, a power source line 81 and a reset control line 84. The power source line 81 is electrically connected to the drains of the amplifying transistor 80 and reset transistor 83. The reset control line 84 is electrically connected to the gate of the reset transistor 83. The power source line 81 and the reset control line 84 correspond to the power source line 53 and the reset control line 56 in FIG. 1, respectively. The gate of the amplifying transistor 80 is electrically connected to the source of the reset transistor 83 and further to the pixels 1, 2 and 3 via the connecting line 70. The amplifying transistor 80 amplifies a signal which is based on change in the voltage of the impurity diffusion regions 10 (connecting line 70) electrically connected to the gate.

The photoelectric conversion elements 71, 74 and 77 generate electric charges depending on incident light quantities by photoelectric conversion. The electric charges generated in the photoelectric conversion elements 71, 74 and 77 are transferred to the impurity diffusion regions 10 (connecting line 70) by a driving circuit 90 controlling the transfer transistors 72, 75 and 78. The impurity diffusion regions 10 accumulate electric charges. A bias current is supplied to the amplifying transistor 80 from a current source 82 so that the amplifying transistor 80 can operate as a source follower. Consequently, the electric charges read out from the pixels 1, 2 and 3 can be read out as electrical signals. The read out signals are input to a signal processing circuit 91 and output from an output terminal 92. The reset transistor 83 is controlled by the driving circuit 90 applying a voltage to the gate of the reset transistor 83 so that the reset transistor 83 provides a reset voltage to the impurity diffusion regions (connecting line 70) to reset the voltage of the impurity diffusion regions 10 to the predetermined reset voltage. At the same time, the transfer transistors 72, 75 and 78 may be controlled by the driving circuit 90. As a result, the reset transistor 83 can provide the reset voltage to the photoelectric conversion elements 71, 74 and to reset the electric charges accumulated in the photoelectric conversion elements 71, 74 and 77.

Figure 3:
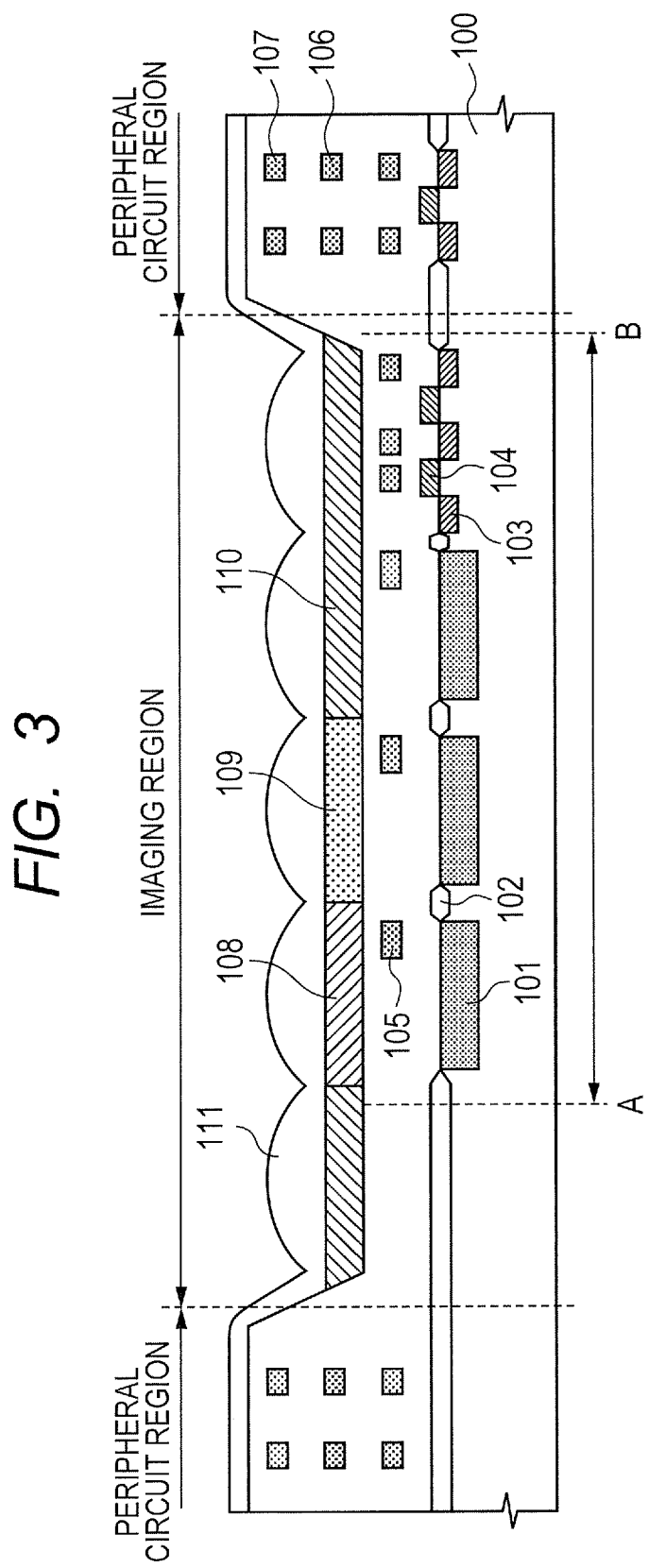
FIG. 3 is a cross-sectional view illustrating the lamination structure of the photoelectric conversion apparatus according to the first embodiment.

FIG. 3 is a cross-sectional view illustrating the laminated structure of the photoelectric conversion apparatus according to the present embodiment. The part of FIG. 3 between reference characters A and B corresponds to the part of FIG. 1 between reference characters A and B. An imaging region includes the plurality of pixels 1, 2 and the read out circuit region 5. A semiconductor substrate 100 has photoelectric conversion elements 101 and an active region 103 for transistors formed on the surface portion of the semiconductor substrate 100. The photoelectric conversion elements 101 and the active region 103 for transistors are isolated from each other by element isolation layers 102. The source of the reset transistor in FIG. 2 corresponds to the active region 103 for transistors, and the impurity diffusion regions 10 of the plurality of photoelectric conversion elements 1 to 3 are mutually connected via the active region 103 formed on the semiconductor substrate 100. A gate electrode 104 of a transistor is formed and a first metal wiring layer 105 is further laminated on the semiconductor substrate 100. The first metal wiring layer 105 corresponds to the gate control lines 13, 23 and 33 in FIG. 1. In the imaging region in FIG. 3, color filters 108, 109 and 110 and micro lenses 111 are laminated above the first metal wiring layer 105. Thus, the color filters 108, 109 and 110 and the micro lenses 111 are provided above the photoelectric conversion element 101. As an example, in a case where primary color filters are used, red (first color), green (second color) and blue (third color) color filters may correspond to the color filters 108, 109 and 110, respectively. Color filters of the same color are arrayed in the main scanning direction, and color filters of different colors are arranged in the subsidiary scanning direction. In other words, a plurality of color filters which transmit light in the same wavelength range are arrayed in the main scanning direction, and a plurality of color filters which transmit light in different wavelength ranges are arrayed adjacently in the subsidiary scanning direction. In surrounding circuit regions in FIG. 3, a second metal wiring layer 106 and a third metal wiring layer 107 are laminated above the first metal wiring layer 105.

According to the present embodiment, the impurity diffusion regions 10 of the pixels 1 to 3 arranged in the subsidiary scanning direction are commonly connected, and the read out circuit region 5 for the pixels 1 to 3 is arranged in the outside in the subsidiary scanning direction from the pixel 3 arranged at the most outside among all of the pixels 1 to 3, as described above. Accordingly, all the metal wirings 105 in the imaging region can be arranged in the main scanning direction except the output of the amplifying transistor 80 electrically connected to the surrounding circuit, i.e., signal processing circuit 91. As a result, the metal wiring layer for the plurality of pixels 1 to 3 is composed of only a single wiring layer including a plurality of wirings arranged in the same height and including the metal wirings of gate control lines 13, 23 and 33. In addition, the metal wirings in the read out circuit region is also composed of only a single wiring layer including a plurality of wirings arranged in the same level and including the metal wirings 52 and 54, power source line 53 and reset control line 56. Thus, the distances from the photoelectric conversion elements 101 to the color filters 108 to 110 and the micro lenses 111 can be reduced to decrease the loss of light due to the multi-layer wiring. In this manner, the distance from a light incident position to the pixel can be reduced to improve the sensitivity of the photoelectric conversion element to the incident light without a decrease in the read out rate of the photoelectric conversion apparatus.

In the present embodiment, the read out circuit region 5 for the pixels 1 to 3 is arranged in the imaging region by way of example. In the lamination structure, a stepped shape may exist at the boundary between the imaging region and the surrounding circuit regions because of the difference in the metal wiring layers thereof. For this reason, in order to form desired color filters 108 to 110 and micro lenses 111, the pixels 1 to 3 and the surrounding circuit regions have to be spaced a certain distance. Thus, providing the read out circuit region 5 for the pixels 1 to in the imaging region enables shorter wirings of the impurity diffusion regions 10 as compared to providing the read out circuit region 5 for the pixels 1 to 3 in the surrounding circuit region, resulting in reduction in the effect of parasitic capacitance. Moreover, since the read out circuit region 5 for the pixels 1 to 3 is arranged in a region for moderating the step shape, the chip size of semiconductors can be reduced.

(Second Embodiment)

Figure 4:
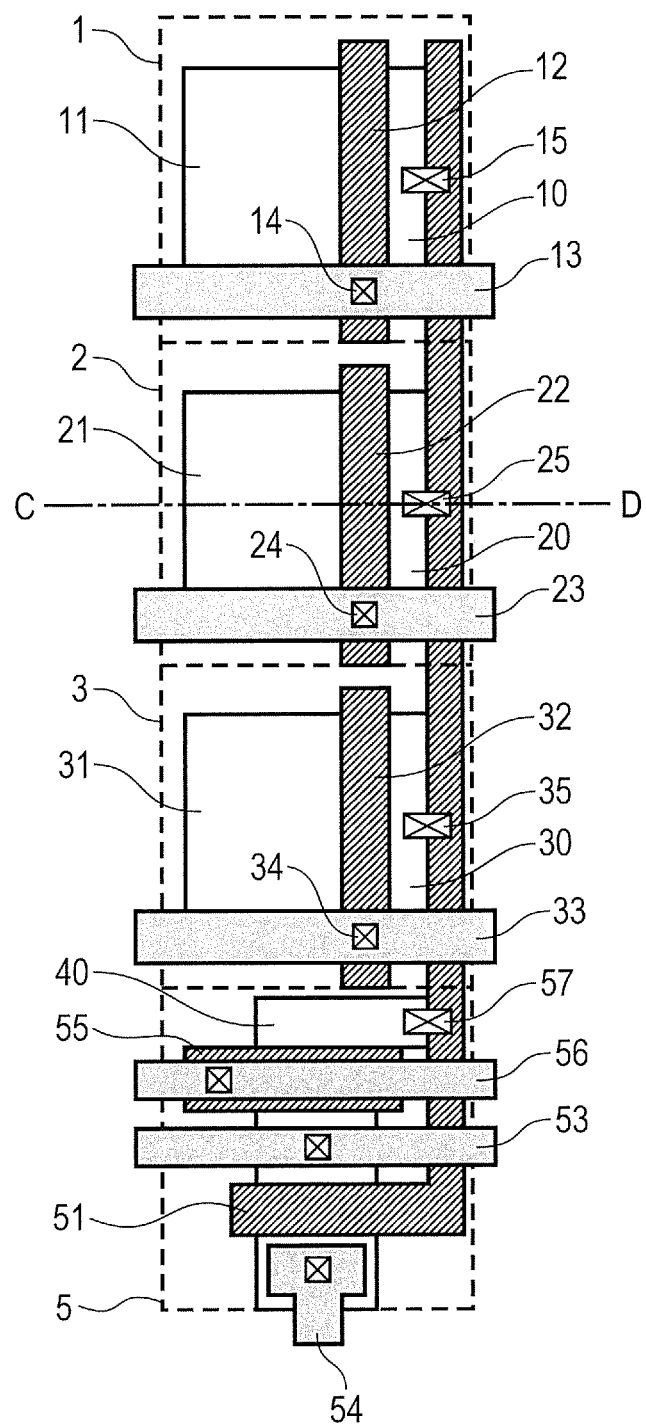
FIG. 4 is a view illustrating an area of imaging region of a photoelectric conversion apparatus according to a second embodiment.

FIG. 4 is an exemplary configuration in an area of imaging region of a photoelectric conversion apparatus according to a second embodiment of the present invention. In FIG. 4, the same components as in FIG. 1 are denoted by the same reference numerals as in FIG. 1. In the following, differences between the present embodiment and the first embodiment will be described. Contact plugs 15, 25, 35 and 57 are formed so as to contact impurity diffusion regions 10, 20 and 30, a drain region 40 of a reset transistor, and a poly silicon wiring extending from a gate electrode 51 of an amplifying transistor, respectively, thereby achieving electrical continuity between them. That is, the impurity diffusion regions 10, 20 and 30 of the plurality of pixels 1, 2 and 3 are mutually and electrically connected by means of the poly silicon wiring extending from the gate electrode 51 of the amplifying transistor via the contact plugs 15, 25 and 35. The impurity diffusion regions 10, 20 and 30 of the pixels 1, 2 and 3 and a read out circuit region 5 are therefore mutually and commonly connected. The contact plugs 15, 25, 35 and 57 are called "shared contacts" because they are shared among the plurality of members.

Figure 5:
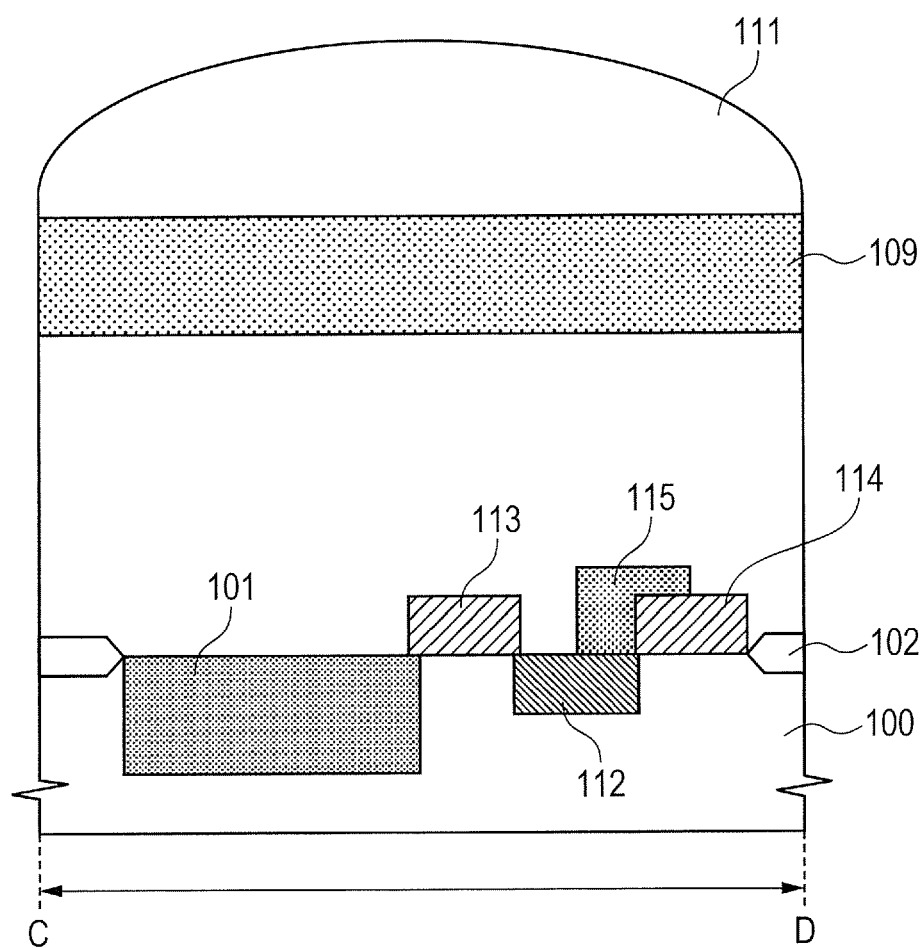
FIG. 5 is a cross-sectional view illustrating the lamination structure of the photoelectric conversion apparatus according to the second embodiment.

FIG. 5 is a cross-sectional view illustrating the lamination structure of the part of FIG. 4 between reference characters C and D. A semiconductor substrate 100 has a photoelectric conversion element 101 and an impurity diffusion region 112 formed on the surface portion of the semiconductor substrate 100. The pixel 2 is isolated by element isolation regions 102. A gate electrode 113 is formed on the semiconductor substrate and corresponds to the gate electrode 22 in FIG. 4. A poly silicon wiring 114 corresponds to the portion extending from the gate electrode 51 of the amplifying transistor in FIG. 4. Shared contact 115 is formed so as to contact the impurity diffusion region 112 and the poly silicon wiring 114. A color filter 109 and a micro lens 111 are also provided.

According to the present embodiment, the impurity diffusion regions 10, 20 and 30 of the pixels 1, 2 and 3 and the drain region 40 of the reset transistor arranged in the subsidiary scanning direction are electrically connected via the poly silicon wiring. This can reduce the parasitic capacitance of wirings as compared to the connection in the surface portion of the semiconductor substrate. When electric charges transferred to the impurity diffusion regions 10, 20 and 30 are converted to electrical signals, the voltages of the signals are inversely proportional to the capacitances of the impurity diffusion regions 10, 20 and 30. Thus, the photoelectric conversion efficiency of the photoelectric conversion apparatus can be improved and the amplitude of an output signal of the photoelectric conversion apparatus can be increased.

It should be noted that in the above embodiments, by way of example, three pixels 1 to 3 are arranged in the subsidiary scanning direction, but the present invention is not limited to those embodiments. For example, a similar effect can be achieved in a case where four pixels are commonly connected, e.g., when complementary color filters are used and four pixels need to be arranged in the subsidiary scanning direction.

(Third Embodiment)

Figure 6:
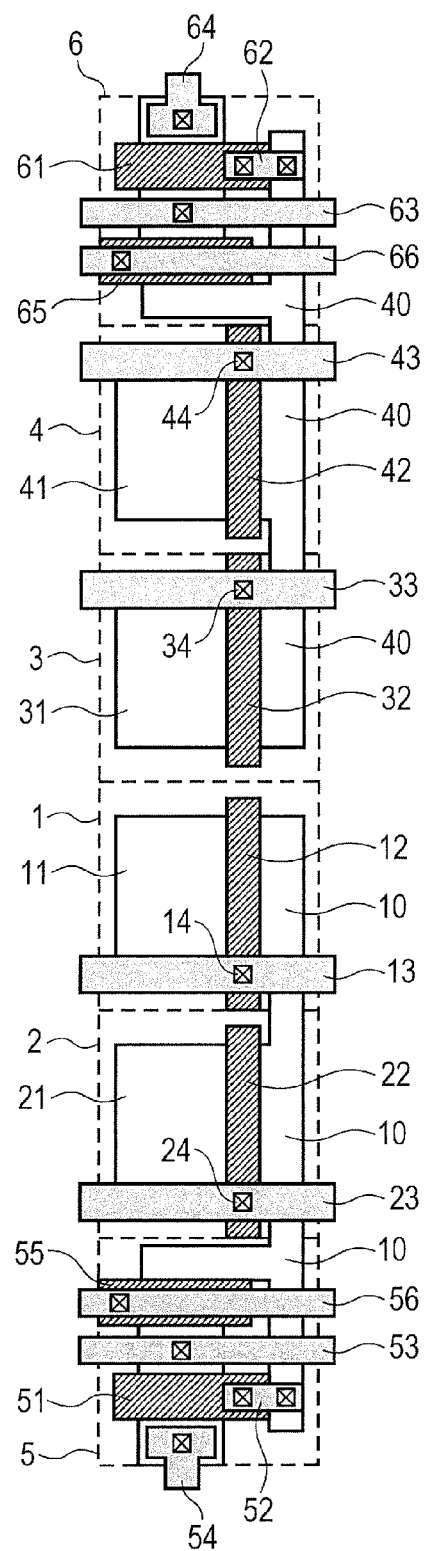
FIG. 6 is a view illustrating an area of imaging region of a photoelectric conversion apparatus according to a third embodiment.

FIG. 6 is an exemplary configuration in an area of imaging region of a photoelectric conversion apparatus according to a third embodiment of the present invention. According to the present embodiment, four pixels 1 to 4 are arranged in the subsidiary scanning direction, the pixels 1 and 2 and a read out circuit region 5 are commonly connected in impurity diffusion regions 10, and the pixels and 4 and a read out circuit region 6 is commonly connected in impurity diffusion regions 40. Parts of the impurity diffusion regions 10 and 40 of the plurality of pixels 1 to 4 are mutually connected. The four pixels 1 to 4 are arranged in the subsidiary scanning direction. The impurity diffusion regions 10 of the pixels 1 and 2 are mutually connected and the impurity diffusion regions 40 of the pixels 3 and 4 are mutually connected. In FIG. 6, the same components as in FIG. 1 are denoted by the same reference numerals as in FIG. 1. In the following, differences between the present embodiment and the first embodiment will be described. In FIG. 6, the pixel 4 includes a photoelectric conversion element 41, a gate electrode 42, a gate control line 43 and an impurity diffusion region 40. The gate control line 43 is composed of a metal wiring and electrically connected to the gate electrode 42 via a contact 44. The gate control line 43 and the gate control lines of other pixels (not shown) arranged in the main scanning direction are commonly connected. The read out circuit region 6 for the pixels 3 and 4 includes an amplifying transistor which uses a gate electrode 61 as its gate and a reset transistor which uses a gate electrode 65 as its gate. The read out circuit region 6 is arranged in the outside in the subsidiary scanning direction from the pixel 4 arranged at the most outside among all of the four pixels 1 to 4. The gate electrode 61 of the amplifying transistor is electrically connected to the impurity diffusion regions 40 via a metal wiring 62, and the drain is electrically connected to a power source line 63 composed of a metal wiring. The gate electrode 65 of the reset transistor is electrically connected to a reset control line 66 composed of a metal wiring, and the drain is electrically connected to the power source line 63. The source of the reset transistor is commonly connected to the impurity diffusion regions 40. A metal wiring 64 electrically connected to the source of the amplifying transistor is electrically connected to a surrounding circuit region.

According to the present embodiment, the capacitances of the impurity diffusion regions 10 and 40 can be reduced because the number of pixels the impurity diffusion regions of which are commonly connected is smaller than that in the above described embodiments. Thus, the photoelectric conversion efficiency of the photoelectric conversion apparatus can be improved and the amplitude of an output signal of the photoelectric conversion apparatus can be increased. In addition, the read out circuit regions 5 and 6 can be read out simultaneously, which enables fast readout of the photoelectric conversion apparatus.

In the photoelectric conversion apparatuses according to the first, second and third embodiments, the mutual and common connection of the impurity diffusion regions of a plurality of pixels enables space-efficient layout of photoelectric conversion elements, while maintaining the sufficient areas of the photoelectric conversion elements. Furthermore, the gate control lines of the pixels in an imaging region can be composed of metal wirings, and the metal wirings in the imaging region can be formed in only a single wiring layer. Consequently, the distance from a light incident surface to the pixel can be reduced to improve the sensitivity of the photoelectric conversion element to light without a decrease in the read out rate of the photoelectric conversion apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-118613, filed May 24, 2012, which is hereby incorporated by reference herein in its entirety.

What is claimed is:

1. A photoelectric conversion apparatus comprising:
a pixel array region in which a plurality of pixels are arranged;
a read out circuit region arranged in an outside of the pixel array region;
a surrounding circuit;
a metal wiring layer;
a plurality of gate control lines; and
a metal wiring, wherein
each of the plurality of pixels includes:
a photoelectric conversion element configured to generate an electric charge by a photoelectric conversion;
an impurity diffusion region; and
a gate electrode configured to transfer the electric charge from the photoelectric conversion element to the impurity diffusion region, wherein
each of the plurality of gate control lines is formed from metal and being connected electrically to the gate electrode of each of the plurality of pixels, and
two or more of the impurity diffusion regions of the plurality of pixels are electrically connected mutually,
the read out circuit region includes:
an amplifier unit connected to the two or more of the impurity diffusion regions, and connected to the surrounding circuit via the metal wiring; and
a reset unit connected to the two or more of the impurity diffusion regions, wherein
each of the plurality of gate control lines has a portion extending in the in-plane direction of a substrate of the photoelectric conversion apparatus, and the metal wiring has a portion extending in the in-plane direction of the substrate so as to be connected to a peripheral circuit, the portion of the plurality of gate control line and the portion of the metal wiring are arranged in the same height in the metal wiring layer.

2. The photoelectric conversion apparatus according to claim 1, wherein the impurity diffusion regions of the plurality of pixels are connected mutually in an activation region formed in a semiconductor substrate.

3. The photoelectric conversion apparatus according to claim 1, wherein the impurity diffusion regions of the plurality of pixels are connected mutually through a poly silicon wiring.

4. The photoelectric conversion apparatus according to claim 3, wherein the impurity diffusion region and the poly silicon wiring are connected through a shared contact.

5. The photoelectric conversion apparatus according to claim 1, wherein an imaging region includes the plurality of pixels and the read out circuit region, and
a metal wiring layer in the imaging region is a single layer including the gate control line.

6. The photoelectric conversion apparatus according to claim 1, wherein
four pixels among the plurality of pixels are arranged along a direction,
the read out region is arranged in an outside in the direction from a pixel arranged at a most outside among the four pixels, and
the impurity diffusion regions of each couple of the four pixels are electrically connected mutually.

7. The photoelectric conversion apparatus according to claim 1, wherein
each of the plurality of gate control lines is formed extending in a first direction,
a pixel of a first color among the plurality of pixels and a pixel of a second color among the plurality of pixels are arranged adjacent each other in a second direction different from the first direction, the first color is different from the second color,
the read out circuit region is arranged in an outside in the second direction from a pixel arranged at a most outside among all of the plurality of pixels.

8. A photoelectric conversion apparatus comprising:
a pixel array region in which a plurality of pixels are arranged; and
a read out circuit region arranged in an outside of the pixel array region;
a surrounding circuit;
a metal wiring layer;
a plurality of gate control lines; and
a metal wiring, wherein
each of the plurality of pixels includes:
a photoelectric conversion element configured to generate an electric charge by a photoelectric conversion;
an impurity diffusion region; and
a gate electrode configured to transfer the electric charge from the photoelectric conversion element to the impurity diffusion region, wherein
each of the plurality gate control lines is formed from a metal extending in a first direction and being connected electrically to the gate electrode of each of the plurality of pixels, and
two or more of the impurity diffusion regions of the plurality of pixels are electrically connected mutually,
a plurality of pixels of a first color is arranged in the first direction, and
a plurality of pixels of a second color is arranged in the first direction,
the first and second colors are different from each other, the pixel of the first color and the pixel of the second color are adjacent to each other in a second direction different from the first direction,
the read out circuit region is arranged in the second direction outside from a pixel arranged at a most outside among all of the plurality of pixels, the read out circuit region includes:
an amplifier unit connected to the two or more of the impurity diffusion regions, and connected to the surrounding circuit via the metal wiring; and
a reset unit connected to the two or more of the impurity diffusion regions,
wherein each of the plurality of gate control lines has a portion extending toward an inside of a substrate of the photoelectric conversion apparatus, and the metal wiring has a portion extending to be connected to a peripheral circuit, the portion of the plurality of gate control line and the portion of the metal wiring are arranged in the same height in the metal wiring layer.

9. The photoelectric conversion apparatus according to claim 8, wherein
the impurity diffusion regions of the plurality of pixels are connected mutually in an activation region formed in a semiconductor substrate,
the impurity diffusion regions of the plurality of pixels are connected mutually through a poly silicon wiring,
the impurity diffusion region and the poly silicon wiring are connected through a shared contact,
an imaging region includes the plurality of pixels and the read out circuit region,
a metal wiring layer in the imaging region is a single layer including the gate control line, and
four pixels among the plurality of pixels are arranged along the second direction, and
the impurity diffusion regions of each couple of the four pixels are electrically connected mutually.

* * * * *